United States Patent [19]

Oishi et al.

[11] Patent Number: 5,536,971
[45] Date of Patent: Jul. 16, 1996

[54] SEMICONDUCTOR DEVICE HAVING A HOLLOW AROUND A GATE ELECTRODE AND A METHOD FOR PRODUCING THE SAME

[75] Inventors: Yoshiro Oishi, Nishinomiya; Daisuke Ueda, Osaka, both of Japan

[73] Assignee: Matsushita Electronics Corporation, Osaka, Japan

[21] Appl. No.: 144,285

[22] Filed: Oct. 27, 1993

[30] Foreign Application Priority Data

Oct. 28, 1992 [JP] Japan ..................................... 4-289878

[51] Int. Cl.⁶ .......................... H01L 29/80; H01L 31/112; H01L 29/76; H01L 23/02
[52] U.S. Cl. ........................ 257/776; 257/410; 257/275; 257/276; 257/728
[58] Field of Search ..................... 257/666, 276, 257/275, 280, 282, 410, 283, 280, 776, 284

[56] References Cited

U.S. PATENT DOCUMENTS

| | | | |
|---|---|---|---|
| 4,972,250 | 11/1990 | Omou et al. | 257/276 |
| 5,219,713 | 6/1993 | Robinson | 437/229 |
| 5,331,203 | 7/1994 | Wojnarowski et al. | 257/776 |

FOREIGN PATENT DOCUMENTS

| | | |
|---|---|---|
| 0501407A1 | 9/1992 | European Pat. Off. |
| 55-91183 | 10/1980 | Japan. |
| 61-190985 | 8/1986 | Japan. |
| 61-255051 | 12/1986 | Japan. |
| 62-281360 | 12/1987 | Japan. |
| 63081983 | 4/1988 | Japan. |
| 1245530 | 9/1989 | Japan. |
| 1283852 | 11/1989 | Japan. |
| 3165526 | 7/1991 | Japan. |
| 3274736 | 12/1991 | Japan. |
| 4298047 | 10/1992 | Japan. |

OTHER PUBLICATIONS

"Electronic Packaging and Interconnection", p. 8.51, C. Harper.
"Webster's Ninth New Collegiate Dictionary", Electrician Electronic, p. 401.
P. D. Gardner et al., "Self–Aligned–Gate GaInAs Microwave MISFET's, *IEEE Electron Device Letters*", vol. EDL-7, No. 6, pp. 363–364 (Jun. 1986).
European Search Report for Corresponding Application No. 93117419.7, date mailed Jan. 7, 1994.

*Primary Examiner*—Sara W. Crane
*Assistant Examiner*—Jhihan Clark
*Attorney, Agent, or Firm*—Ratner & Prestia

[57] ABSTRACT

A semiconductor device operating at a high frequency, includes: a semiconductor layer; a first electrode for being applied with a voltage to control a current flowing in the semiconductor layer; a second electrode and a third electrode electrically connected to the semiconductor layer, at least one of the second and third electrodes being elongated above the first electrode to form a hollow around the first electrode by surrounding the first electrode with the second and third electrodes and the semiconductor layer; a passivation film formed over the second and third electrodes; and wherein the first electrode is directly in contact with an atmosphere in the hollow.

16 Claims, 3 Drawing Sheets

SEMICONDUCTOR DEVICE HAVING A HOLLOW AROUND A GATE ELECTRODE AND A METHOD FOR PRODUCING THE SAME

BACKGROUND OF THE INVENTION

1. Field of the Invention

The present invention relates to a semiconductor device or an integrated circuit which operates at a high speed or at a high frequency such as at a microwave band, and to a method for producing the same.

2. Description of the Related Art

There are recent demands for transistors or integrated circuits which operate at a high speed or at a microwave band, and such transistors or integrated circuits are being intensively researched and developed.

FIG. 4 schematically shows a cross sectional view of a conventional field effect transistor (hereinafter referred to as FET) 100 operating at a microwave band. The FET 100 is formed on a semiinsulating gallium arsenide (hereinafter referred to as GaAs) substrate 101. An n-type GaAs layer 102 is formed on the GaAs substrate 101. The n-type GaAs layer 102 is doped with silicon as n-type impurities and functions as an active layer. A source electrode 105 and a drain electrode 106 are formed on the n-type GaAs layer 102 for ohmic contact. The n-type GaAs layer 102 has a recess 103 at a surface of the n-type GaAs layer 102. The recess 103 is positioned between the source electrode 105 and the drain electrode 106. A gate electrode 104 is formed on the recess 103, and the gate electrode 104 forms Schottky connection with the n-type GaAs layer 102. The entire surface of the FET 100 is covered with a passivation film 107 made of a material such as silicon oxide, phosphosilicate glass, silicon nitride, etc.

In the FET 100, a depletion region 108 is formed in a region of the n-type GaAs layer 102 under the gate electrode 104 and prevents a current from flowing between the source electrode 105 and the drain electrode 106. The thickness of the depletion region 108 is changed by a gate voltage applied to the gate electrode 104. Thus, the gate voltage can control the current between the source electrode 105 and the drain electrode 106. The thickness of the depletion region 108 should be changed as quickly as possible in accordance with the potential of the gate electrode so as to operate the FET 100 at a high frequency. It is necessary to reduce gate capacitance, particularly a capacitance between the gate electrode 104 and the source electrode 105 (hereinafter referred to as capacitance $C_{gs}$) for improvement of device characteristics at a high frequency.

In the conventional FET 100 as is explained above, the gate electrode 104 is covered with the passivation film 107 to protect the FET 100 from humidity, dust, and chemicals causing atmospheric corrosion. However, the passivation film 107 has a larger dielectric constant, which increases the capacitance $C_{gs}$. Therefore, the FET 100 has a large capacitance $C_{gs}$, which degrades device characteristics at the microwave band of the FET 100. Moreover, when the FET 100 is molded in a plastic package, the gate electrode 104 is in contact with the plastic package via the passivation film 107. Thus, the device characteristics are more degraded because of the high dielectric constant of the plastic package.

In view of the aforementioned shortcomings associated with conventional transistors, there is a need in the art for a transistor which has a small gate capacitance and good device characteristics at a high frequency.

SUMMARY OF THE INVENTION

The semiconductor device of this invention, includes: a semiconductor layer; a first electrode for being applied with a voltage to control a current flowing in the semiconductor layer; a second electrode and a third electrode electrically connected to the semiconductor layer, at least one of the second and third electrodes being elongated above the first electrode to form a hollow around the first electrode by surrounding the first electrode with the second and third electrodes and the semiconductor layer; a passivation film formed over the second and third electrodes; and wherein the first electrode is directly in contact with an atmosphere in the hollow.

According to another aspect of the invention, a semiconductor device is provided. The semiconductor device includes: a semiconductor layer; a first electrode having a top face for being applied with a voltage to control a current flowing in the semiconductor layer; a second electrode and a third electrode electrically connected to the semiconductor layer, each having an upper face which is higher than the top face of the first electrode; a passivation film formed over the upper faces of the second and third electrodes, thereby forming a hollow surrounded with the second and third electrodes, the passivation film, and the semiconductor layer; and wherein at least part of the first electrode is directly in contact with an atmosphere in the hollow.

According to still another aspect of the invention, a method for producing a semiconductor device is provided. The method includes the steps of: forming a semiconductor layer; forming a first electrode for being applied with a voltage to control a current flowing in the semiconductor layer; forming a second electrode and a third electrode electrically connected to the semiconductor layer, the second and third electrodes forming a hollow around the first electrode; and forming a passivation film on the second and third electrodes and above the hollow so that the first electrode is directly in contact with an atmosphere in the hollow.

According to a semiconductor device of the present invention, a gate electrode is directly in contact with an atmosphere in a hollow, and is not covered with a passivation film having a high dielectric constant.

According to a method for producing a semiconductor device of the present invention, a gate electrode is directly in contact with an atmosphere in a hollow, and is not covered with a passivation film having a high dielectric constant.

Thus, the invention described herein makes possible the advantages of (1) providing a semiconductor device which has good device characteristics at a high frequency because of a sufficient low gate capacitance and (2) providing a method for producing a semiconductor device which has good device characteristics at a high frequency.

These and other advantages of the present invention will become apparent to those skilled in the art upon reading and understanding the following detailed description with reference to the accompanying figures.

DESCRIPTION OF THE PREFERRED EMBODIMENTS

EXAMPLE 1

Figure 1A:
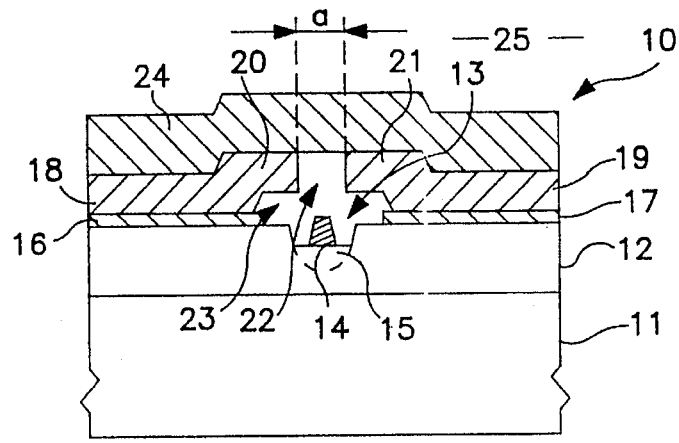
FIG. 1A shows a schematic cross sectional view of a semiconductor device according to a first example of the present invention.

FIG. 1A shows a schematic cross-sectional view of a transistor 10 of the present invention. The transistor 10 is a field effect transistor suitable for operating at a high frequency such as a microwave band. The transistor 10 has a substrate 11 made of semi-insulating GaAs semiconductor. An n-type GaAs layer 12 is formed on the substrate 11 and is doped with silicon. A recess 13 is formed at a surface of the n-type GaAs layer 12. A gate electrode 14 is formed on the recess 13 as a first electrode and forms a Schottky contact with the n-type GaAs layer 12. The gate electrode 14 is applied with a gate voltage having a high frequency component, and the gate voltage generates a depletion region 15 in a part of the n-type GaAs layer 12 under the gate electrode 14. The thickness of the depletion region 15 changes based on the potential of the gate voltage. Accordingly, the current flowing in the n-type GaAs layer 12 is controlled by the gate voltage.

A source electrode 16 and a drain electrode 17 are formed on the n-type GaAs layer 12, so that the gate electrode 14 is positioned between the source electrode 16 and the drain electrode 17. The source electrode 16 and the drain electrode 17 are electrically connected to the n-type GaAs layer 12 with ohmic contact. A source overlay electrode 18 and a drain overlay electrode 19 are respectively formed on the source electrode 16 and the drain electrode 17. The source electrode 16 and the source overlay electrode 18 constitute a second electrode, and the drain electrode 17 and the drain overlay electrode 19 constitute a third electrode. The source overlay electrode 18 and the drain overlay electrode 19 respectively have protrusions 20 and 21, both of which are elongated above the gate electrode 14; The protrusions 20 and 21 are apart from each other by a distance a, and an insulating space 22 is formed within the protrusions 20 and 21. A hollow 23 is formed by being surrounded with the protrusions 20 and 21 and the n-type GaAs layer 12.

A passivation film 24 is formed over the source overlay electrode 18 and the drain overlay electrode 19 and above the insulating space 22. Because the passivation film 24 is formed above the insulating space 22, the hollow 23 and the insulating space 22 connected therewith are sealed without being in contact with the outer atmosphere 25. The gate electrode 14 is directly in contact with only an atmosphere in the hollow 23.

A surface of the gate electrode 14 is not covered with the passivation film 24 nor any other passivating material having a high dielectric constant. The gate electrode 14 is covered with only the atmosphere in the hollow 23. Accordingly, the gate electrode 14 has a much smaller gate capacitance, particularly, a smaller capacitance $C_{gs}$ than that of a conventional transistor. This results in improvements of device characteristics of the transistor 10 at a high frequency. Moreover, because the gate electrode 14 is not in contact with the outer atmosphere 25, the gate electrode 14 is not oxidized nor corroded by humidity and chemicals contained in the outer atmosphere 25. As a result, the device characteristics are not degraded during operation for a long time, and the transistor 10 has a sufficient reliability.

Referring to FIGS. 1A to 1E, a method for producing the transistor 10 is now explained.

Figure 1B:
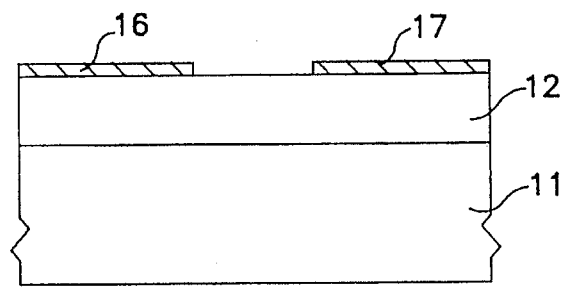
FIGS. 1B to 1E illustrate a method of producing the semiconductor device shown in FIG. 1A.

As is shown in FIG. 1B, an n-type GaAs layer 12 is formed on a substrate 11 of a semi-insulating GaAs semiconductor by an epitaxial growth method such as MBE (molecular beam epitaxy) or MOCVD (metal organic chemical vapor deposition), etc. The n-type GaAs layer 12 is doped with silicon. After etching a part of the n-type GaAs layer 12 and the substrate 11 for isolation (not shown), a source electrode 16 and a drain electrode 17 are each formed on the n-type GaAs layer 12 by a lift-off method. The source electrode 16 and the drain electrode 17 are made of a multi-layer metal film of AuGe, Ni, and Au. The substrate 11 is heated at 450° C. for 5 minutes for alloying, thereby forming ohmic contact between the n-type GaAs layer 12 and both the source electrode 16 and the drain electrode 17.

Figure 1C:
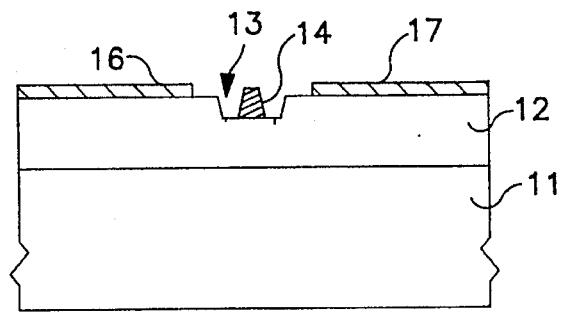

As is shown in FIG. 1C, after forming a resist pattern (not shown) which defines a gate electrode on the n-type GaAs layer 12, the n-type GaAs layer 12 is etched by a depth of 0.2 μm, thereby forming a recess 13 at the surface of the n-type GaAs layer 12. After a multi-layer metal film of Ti/Al (not shown) is successively deposited by a thickness of about 0.5 μm over the a entire surface of the substrate 11, a gate electrode 14 is formed by removing the resist pattern.

Figure 1D:
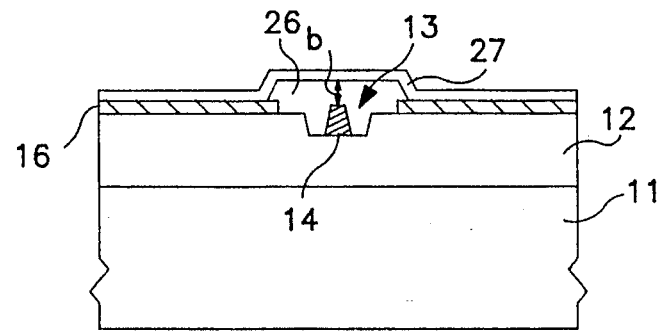

As is shown in FIG. 1D, after a resist pattern 26 is formed over the gate electrode 14 and the recess 13, a multi-layer metal film 27 of Ti/Au is deposited over the entire surface of the substrate 11 to a thickness of about 0.2 μm. The resist pattern 26 defines a hollow 23 (shown in FIG. 1A). The resist pattern 26 covers above the top of the gate electrode 14 by a distance b so that the gate electrode 14 is not easily in contact with overlay electrodes 18 and 19 (formed later) by an outer force. The distance b is preferably 0.2 μm or more, more preferably, 1.0 μm or more.

Figure 1E:
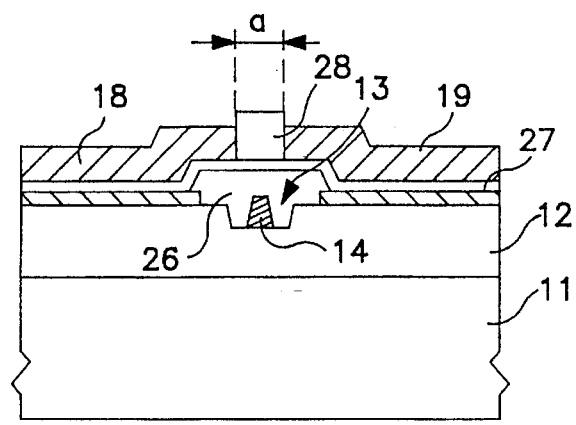

A resist pattern 28, as is shown in FIG. 1E, is formed on the multi-layer metal film 27. A part of the resist pattern 28 defines an insulating space 22 (shown in FIG. 1A). The resist pattern 28 preferably has a sufficient width a so that a source overlay electrode 18 and a drain overlay electrode 19 (formed later) can not be in contact with each other. On the other hand, the width a preferably is sufficiently small so that a material for a passivation film 24 (shown in FIG. 1A) can not sink into the hollow 23 through the insulating space 22 (shown in FIG. 1A). For the aforementioned reasons, the width a is preferably in a range of about 0.3 to 1.0 μm. The source overlay electrode 18 and the drain overlay electrode 19 are respectively formed on the source electrode 16 and the drain electrode 17 by a plating method. The source overlay electrode 18 and the drain overlay electrode 19 are each made of gold and have a thickness of about 2.0 μm. Then, the resist patterns 26 and 28 and a part of the multi-layer metal film 27 are removed.

As is shown in FIG. 1A, the material for the passivation film 24 is coated over the entire surface of the substrate 11 by a spin coat method. The material for passivation film 24 is preferably highly viscous so that the material may not sink into the hollow 23 through the insulating space 22 and will not cover any part of the gate electrode 14. Specifically, the material is made of polyimide and has a coefficient of viscosity of 1000 cp (centi-poise) or more. The material is, then, harden by heating, thereby forming the passivation film 24 on the source overlay electrode 18 and the drain overlay electrode 19 and above the insulating space 22. In this example, a passivation film of polyimide is used. It is understood that other material which has a sufficiently high viscosity and can be coated by a spin coat method also may be used.

As is explained above, in the transistor 10 of the present invention, the gate electrode 14 is in contact with the atmosphere in the hollow 23 and is not covered with any material having a high dielectric coefficient. Accordingly, the capacitance $C_{gs}$ of the transistor 10 can be reduced to one third of the capacitance of the conventional transistor. This results in an improvement of a gain by 4 dB at 12 GHz, for example. Moreover, because the passivation film 24 completely isolates the atmosphere in the hollow from the outer atmosphere 25, the gate electrode 14 is not oxidized nor corroded by humidity and chemicals contained in the outer atmosphere 25. As a result, the device characteristics are not degraded during operation for a long time, and the transistor 10 has a sufficient reliability.

EXAMPLE 2

Figure 2:
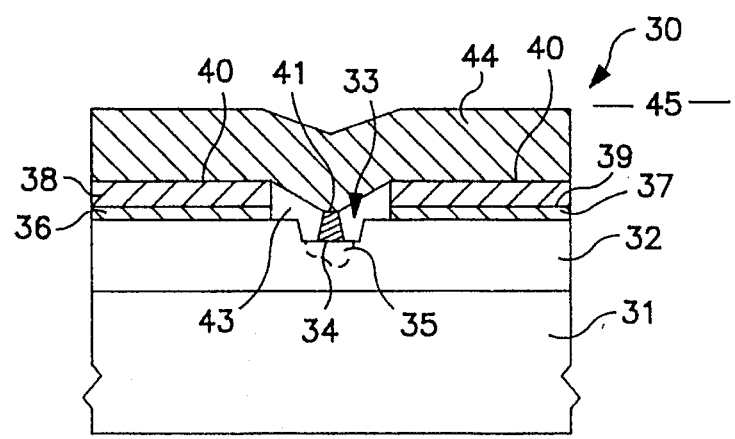
FIG. 2 shows a schematic cross-sectional view of a semiconductor device according to a second example of the present invention.

FIG. 2 shows a schematic cross-sectional view of a transistor 30 according to a second example of the present invention. The transistor 30 is a field effect transistor suitable for operating at a high frequency such as a microwave band. The transistor 30 has a substrate 31 made of semi-insulating GaAs semi-conductor. An n-type GaAs layer 32 is formed on the substrate 31 and is doped with silicon. A recess 33 is formed at a surface of the n-type GaAs layer 32. A gate electrode 34 is formed on the recess 33 as a first electrode and forms a Schottky contact with the n-type GaAs layer 32. The gate electrode 34 is applied with a gate voltage having a high frequency component, and the gate voltage generates depletion region 35 in a part of the n-type GaAs layer. 32 under the gate electrode 34. The thickness of a depletion region 35 changes based on the potential of the gate voltage. Accordingly, the current flowing in the n-type GaAs layer 32 is controlled by the gate voltage.

A source electrode 36 and a drain electrode 37 are formed on the n-type GaAs layer 32, so that the gate electrode 34 is positioned between the source electrode 36 and the drain electrode 37. The source electrode 36 and the drain electrode 37 are electrically connected to the n-type GaAs layer 32 with ohmic contact. A source overlay electrode 38 and a drain overlay electrode 39 are respectively formed on the source electrode 36 and the drain electrode 37. The source electrode 36 and the source overlay electrode 38 constitute a second electrode, and the drain electrode 37 and the drain overlay electrode 39 constitute a third electrode. The surfaces 40 of both the source overlay electrode 38 and the drain overlay electrode 39 are higher than the top 41 of the gate electrode 34. A hollow 43 is formed around the gate electrode 34.

A passivation film 44 is formed over the source overlay electrode 38 and the drain overlay electrode 39, and the top 41 of the gate electrode 34, and above the hollow 43. Because the passivation film 44 is formed above the hollow 43, the hollow 43 is sealed without being in contact with the outer atmosphere 45. The gate electrode 34 is directly in contact with an atmosphere in the hollow 43.

Only the top 41 of the gate electrode 34 is in contact with the passivation film 44, and no passivating material having a high dielectric constant covers any other surfaces of the gate electrode 34 except the top 41. Accordingly, the gate electrode 34 has a much smaller instinct capacitance, particularly, a capacitance $C_{gs}$ than that of a conventional transistor. This results in-the improvements of device characteristics at a high frequency of the transistor 30. Moreover, because the gate electrode 34 is not in contact with the outer atmosphere 45, the gate electrode 34 is not oxidized nor corroded by humidity and chemicals contained in the outer atmosphere 45. As a result, the device characteristics are not degraded during operation for a long time, and the transistor 30 has a sufficient reliability.

The transistor 30 is produced by the same method as is explained in Example 1 until formation of a source overlay electrode 38 and a drain overlay electrode 39. After forming the source overlay electrode 38 and the drain overlay electrode 39, a sheetlike polyimide film having a thickness of about 50 µm is formed over the entire surface of the substrate 31. By making the polyimide film adhere over the entire surface of the substrate 31 while evacuating the air between the substrate 31 and the polyimide film, the polyimide film adheres to the surfaces 40 of both the source overlay electrode 38 and the drain overlay electrode 39 and to the top 41 of the gate electrode 34. The polyimide film, then, becomes a passivation film 44 which is retained on the surfaces 40 of both the source overlay electrode 38 and the drain overlay electrode 39 and on the top 41 of the gate electrode 34. The polyimide film has an thickness of about 50 µm enough to keep the polyimide film from sinking into the hollow 43. As is shown in FIG. 2, in the transistor 30, the passivation film 44 is in contact with the top 41 of the gate electrode 34. Alternatively, the passivation film 44 need not be in contact with the top 41 of the gate electrode 34. In this example, the passivation film of polyimide is used. It is understood that any other material which is sheet-like and is suitable for passivation also may be used.

As is explained above, in the transistor 30 of the present invention, the gate electrode 34 is in contact with the atmosphere in the hollow 43 and is not covered with any material having a high dielectric coefficient. Accordingly, the capacitance $C_{gs}$ of the transistor 30 can be reduced to a half of the capacitance of the conventional transistor. This results in an improvement of gain by 3 dB at 12 GHz, for example. Moreover, because the passivation film 44 completely isolates the atmosphere in the hollow 43 from the outer atmosphere 45, the gate electrode 34 is not oxidized nor corroded by humidity and chemicals contained in the outer atmosphere 45. As a result, the device characteristics are not degraded during operation for a long time, and the transistor 30 has a sufficient reliability.

EXAMPLE 3

Figure 3A:
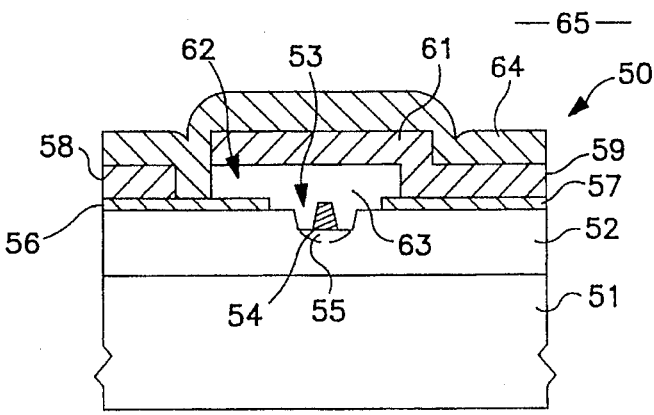
FIG. 3A shows a schematic cross-sectional view of a semiconductor device according to a third example of the present invention.

FIG. 3A shows a schematic cross-sectional view of a transistor 50 of the present invention. The transistor 50 is a field effect transistor suitable for operating at a high frequency such as a microwave band. The transistor 50 has a substrate 51 made of semi-insulating GaAs semiconductor. An n-type GaAs layer 52 is formed on the substrate 51 and is doped with silicon. A recess 53 is formed at a surface of the n-type GaAs layer 52. A gate electrode 54 is formed on the recess 53 as a first electrode and forms a Schottky contact with the n-type GaAs layer 52. The gate electrode 54 is applied with a gate voltage having a high frequency component, and the gate voltage generates a depletion region 55 in a part of the n-type GaAs layer 52 under the gate electrode 54. The thickness of the depletion region 55 changes based on the potential of the gate voltage. Accordingly, the current flowing in the n-type GaAs layer 52 is controlled by the gate voltage.

A source electrode 56 and a drain electrode 57 are formed on the n-type GaAs layer 52, so that the gate electrode 54 is positioned between the source electrode 56 and the drain electrode 57. The source electrode 56 and the drain electrode 57 are electrically connected to the n-type GaAs layer 52 with ohmic contact. A source overlay electrode 58 and a drain overlay electrode 59 are respectively formed on the source electrode 56 and the drain electrode 57. The source electrode 56 and the source overlay electrode 58 constitute a second electrode, and the drain electrode 57 and the drain overlay electrode 59 constitute a third electrode. The drain overlay electrode 59 has a protrusion 61, which is elongated above the gate electrode 54 and toward the source overlay electrode 58. An insulating space 62 is formed between the protrusion 61 and the source electrode 56. A hollow 63 is formed by being surrounded substantially with the protrusion 61 and the n-type GaAs layer 52.

A passivation film 64 is formed over the source overlay electrode 58 and the drain overlay electrode 59 and above the insulating space 62. Because the passivation film 64 is formed above the insulating space 62, the hollow 63 and the insulating space 62 connected therewith are sealed without being in contact with the outer atmosphere 65. The gate electrode 54 is directly in contact with only the atmosphere in the hollow 63.

The surface of the gate electrode 54 is not covered with the passivation film 64 nor any other passivating material having a high dielectric constant. The gate electrode 54 is covered with only the atmosphere in the hollow 63. Accordingly, the gate electrode 54 has a much smaller instinct capacitance, especially, a capacitance $C_{gs}$ than that of a conventional transistor. This results in improvements of device characteristics at a high frequency of the transistor 50. Moreover, because the gate electrode 54 is not in contact with the outer atmosphere 65, the gate electrode 54 is not oxidized nor corroded by humidity and chemicals contained in the outer atmosphere 65. As a result, the device characteristics are not degraded during operation for a long time, and the transistor 50 has a sufficient reliability.

Figure 3B:
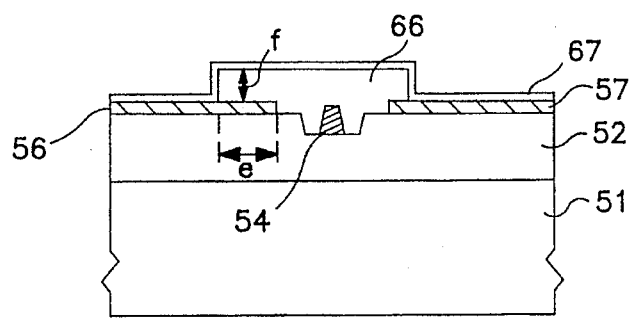
FIGS. 3B and 3C illustrate a method of producing the semiconductor device shown in FIG. 3A.

The transistor 50 is produced by the same method as that is explained in Example 1 until formation of a source electrode 56 and a drain electrode 57. After forming the source electrode 56 and the drain electrode 57, as is shown in FIG. 3B, a resist pattern 66 is formed over the gate electrode 54 and the recess 53, as is shown in FIG. 3A. A multi-layer metal film 67 of Ti/Au is deposited over the entire surface of the substrate 51 to a thickness of about 0.2 μm. The resist pattern 66 defines a hollow 63 and an insulating space 62. The resist pattern 66 overlaps the source electrode 56 by a distance e and has a thickness f above the source electrode 56. The distance e is preferably long and the thickness f is preferably small so that a mixed reaction gas for a passivation film 64 does not easily penetrate into the hollow 63 and the passivation film 64 (formed later) is not formed on the gate electrode 54. Specifically, the distance e is preferably in a range of 0.5 to 2.0 μm, and the thickness f is preferably in a range of 0.5 to 3.0 μm.

Figure 3C:
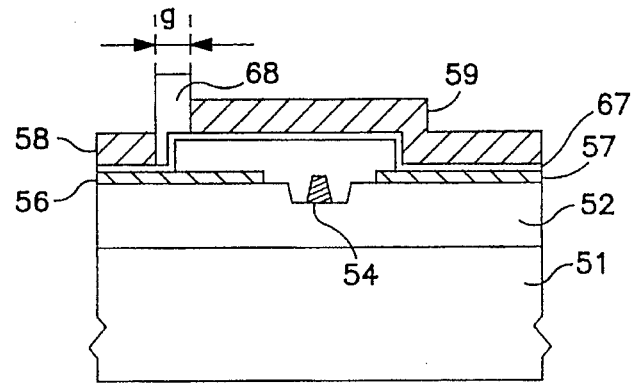
Figure 4:
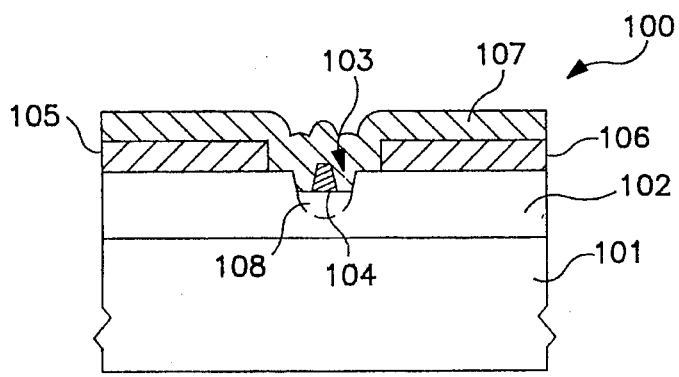
FIG. 4 shows a schematic cross-sectional view of a conventional semiconductor device.

A resist pattern 68, as is shown in FIG. 3C, is formed on the multi-layer metal film 67. The resist pattern 68 defines the other part of the insulating space 62. The resist pattern 68 preferably has a sufficient width g so that a source overlay electrode 58 and a drain overlay electrode 59 both formed later can not be in contact with each other. Specifically, the width g is preferably in a range of 0.3 to 1.0 μm.

The source overlay electrode 58 and the drain overlay electrode 59 are respectively formed on the source electrode 56 and the drain electrode 57 by a plating method. The source overlay electrode 58 and the drain overlay electrode 59 are made of gold and have a thickness of 2.0 μm. Then, the resist patterns 66 and 68 and a part of the multi-layer metal film 67 are removed.

As is shown in FIG. 3A, the passivation film 64 is formed over the entire surface of the substrate 51 by a CVD method. The passivation film 64 is made of silicon nitride. In order that the passivation film 64 is not formed on the gate electrode 54, the reaction pressure for forming the passivation film 64 is preferably high. Specifically, the reaction pressure is preferably more than 0.5 Torr. An atmospheric pressure CVD is also preferable. Under such high pressure, a mean free path of the mixed reaction gas is sufficiently short, and the mixed reaction gas does not reach into the hollow 63.

As is explained above, in the transistor 50 of the present invention, the gate electrode 54 is in contact with the atmosphere in the hollow 63 and is not covered with any material having a high dielectric constant. Accordingly, the capacitance $C_{gs}$ of the transistor 50 can be reduced to one third of the capacitance of the conventional transistor. This results in an improvement of a gain by 4 dB at 12 GHz, for example. Moreover, because the passivation film 64 completely isolates the atmosphere in the hollow from the outer atmosphere 65, the gate electrode 54 is not oxidized nor corroded by humidity and chemicals contained in the outer atmosphere 65. As a result, the device characteristics are not degraded during operation for a long time, and the transistor 50 has a sufficient reliability.

As is explained in Examples 1 to 3, in the transistors of the present invention, the gate electrode is in contact with the atmosphere in the hollow and is not covered with any materials having a high dielectric coefficient. Accordingly, The transistor of the present invention has a sufficient small capacitance $C_{gs}$ to improve device characteristics at a high frequency such as at a microwave band. Moreover, in the case where the transistor of the present invention is molded in a plastic package, the plastic package is in contact with the passivation film, but is not in contact with the gate electrode via any materials having high dielectric constant. Therefore, there is little increase in the capacitance $C_{gs}$.

The present invention can solve problems common to semiconductor devices which operate at a high frequency such as at a microwave band. Therefore, it is understood that the present invention is not limited to field effect transistors having a gate electrode, but can be applied to other devices operating at a high frequency such as heterojunction bipolar transistors. In the case where the present invention is applied to such heterojunction bipolar transistors, a base electrode is regarded as a first electrode applied with a voltage having a high frequency component. Also, it is understood that the present invention can be applied to integrated circuits using field effect transistors or heterojunction bipolar transistors operating at a high frequency.

Some exemplary values for distances of overlay electrodes and other dimensions are mentioned above. It will be appreciated that other values which will enable operation of the invention described also may be used. Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device operating at a high frequency, comprising:

a semiconductor layer; a first electrode for being applied with a voltage to control a current flowing in said semiconductor layer;

a second electrode and a third electrode electrically connected to said semiconductor layer, at least one of said second and third electrodes being elongated above said first electrode to form a hollow around said first electrode by surrounding said first electrode with said second and said third electrodes and said semiconductor layer;

a passivation film formed over said second and said third electrodes and a space between said second and third electrodes, such that said hollow is sealed by said passivation film; and wherein said first electrode is directly in contact with an atmosphere in said hollow.

2. A semiconductor device of claim 1, wherein said passivation film is formed by using a sufficiently high viscous material for said passivation film so as not to sink into said hollow.

3. A semiconductor device of claim 1, wherein said passivation film is formed by a CVD method with a sufficiently high pressure so as not to be formed in said hollow.

4. A semiconductor device according to claim 1, wherein said semiconductor layer has a recess between said second electrode and said third electrode, and said first electrode is formed on said recess.

5. A semiconductor device according to claim 1, wherein said semiconductor device is a field effect transistor.

6. A semiconductor device according to claim 1, wherein said semiconductor device is a bipolar transistor.

7. A semiconductor device according to claim 5, wherein said first electrode is a gate electrode.

8. A semiconductor device according to claim 6, wherein said first electrode is a base electrode.

9. A semiconductor device operating at a high frequency, comprising:

a semiconductor layer;

a first electrode having a top face for being applied with a voltage to control a current flowing in said semiconductor layer;

a second electrode and a third electrode electrically connected to said semiconductor layer, each having an upper face which is higher than said top face of said first electrode, wherein said semiconductor layer has a recess between said second electrode and said third electrode, and said first electrode is formed on said recess;

a passivation film supported on said upper faces of said second and third electrodes and over a space between said second and third electrodes, such that a hollow surrounded with said second and third electrodes and said semiconductor layer is sealed by said passivation film; and wherein at least part of said first electrode is directly in contact with an atmosphere in said hollow.

10. A semiconductor device of claim 9, wherein said passivation film is formed by making a sheet-like film adhere over said semiconductor layer.

11. A semiconductor device according to claim 9, wherein a top of said first electrode is in contact with said passivation film.

12. A semiconductor device according to claim 9, wherein said semiconductor device is a field effect transistor.

13. A semiconductor device according to claim 9, wherein said semiconductor device is a bipolar transistor.

14. A semiconductor device according to claim 9, wherein said passivation film is made of polyimide.

15. A semiconductor device according to claim 12, wherein said first electrode is a gate electrode.

16. A semiconductor device according to claim 13, wherein said first electrode is a base electrode.

* * * * *